US006179953B1

(12) United States Patent
Deevi et al.

(10) Patent No.: US 6,179,953 B1
(45) Date of Patent: Jan. 30, 2001

(54) METHOD FOR MAKING ELECTRONIC CIRCUITS HAVING NIAL AND NI₃AL SUBSTRATES

(75) Inventors: Seetharama C. Deevi, Midlothian, VA (US); Vinod K. Sikka, Oak Ridge, TN (US)

(73) Assignee: UT-Battelle, LLC, Oak Ridge, TN (US)

( * ) Notice: Under 35 U.S.C. 154(b), the term of this patent shall be extended for 0 days.

(21) Appl. No.: 09/260,124

(22) Filed: Mar. 2, 1999

Related U.S. Application Data

(62) Division of application No. 08/969,665, filed on Nov. 13, 1997, now Pat. No. 5,965,274.

(51) Int. Cl.⁷ .............................. B32B 31/00; H01L 23/14; H05K 3/00

(52) U.S. Cl. ........................ 156/322; 156/295; 156/277; 228/180.1; 438/119

(58) Field of Search .................... 156/292, 295, 156/277, 322; 228/180.1; 438/119

(56) References Cited

U.S. PATENT DOCUMENTS 4,500,605 * 2/1985 Fister et al. ..................... 428/469

* cited by examiner

*Primary Examiner*—Francis J. Lorin
(74) *Attorney, Agent, or Firm*—J. Kenneth Davis

(57) ABSTRACT

A method for making electronic circuit component having improved mechanical properties and thermal conductivity comprises steps of providing NiAl and/or Ni₃Al, and forming an alumina layer thereupon prior to applying the conductive elements. Additional layers of copper-aluminum alloy or copper further improve mechanical strength and thermal conductivity.

9 Claims, 1 Drawing Sheet

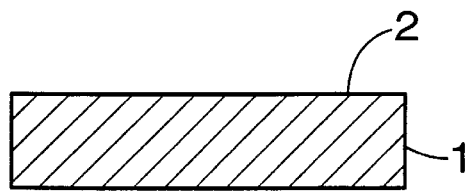
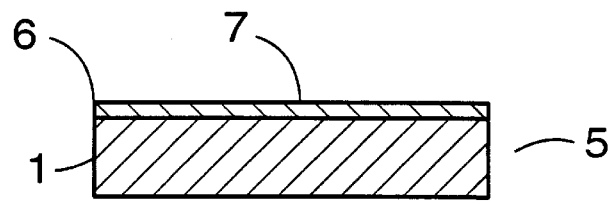
FIG. 1          FIG. 2
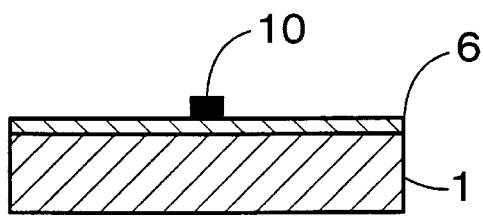
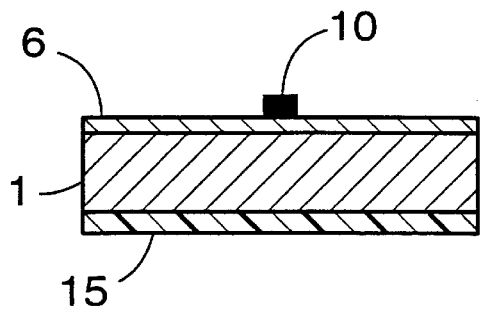
FIG. 3          FIG. 4

METHOD FOR MAKING ELECTRONIC CIRCUITS HAVING NIAL AND NI₃AL SUBSTRATES

CROSS-REFERENCE TO RELATED APPLICATIONS

This application is a divisional application of parent U.S. Application Ser. No. 08/969,665, "Electronic Circuits Having NiAl and Ni₃Al Substrates by Seetharama C. Deevi and Vinod K. Sikka filed on Nov. 13, 1997, now U.S. Pat. No. 5,965,274.

The United States Government has rights in this invention pursuant to contract no. DE-AC05-84OR21400 between the United States Department of Energy and Lockheed Martin Energy Systems, Inc.

FIELD OF THE INVENTION

The present invention relates to electronic printed circuits and materials and methods for making electronic printed circuits and more particularly to circuit board substrates made from aluminide-forming metallic materials which provide an insulating alumina surface on the metal.

BACKGROUND OF THE INVENTION

During the last several decades, ordered intermetallics (based on aluminides of transition metals such as nickel, iron, titanium, niobium, and cobalt) have been under investigation for their possible use as high-temperature structural materials. Aluminides of transition metals possess sufficiently high concentrations of aluminum to form a continuous, fully adherent alumina layer on the surface when exposed to air or oxygen atmospheres. The amount of aluminum present in aluminides can range from 10 to 30 wt % and is significantly higher than the aluminum concentrations present in conventional alloys and superalloys. In the case of nickel and iron aluminides, the alumina layer formed on the surface of the materials is responsible for their excellent oxidation and carburization resistances even at temperatures of 1000° C. or higher. Therefore, aluminides, unlike conventional steels and superalloys based on nickel, iron, and cobalt, do not necessarily require chromium to form an oxide layer on the surface of the material to protect against high-temperature oxidation and corrosion. Alumina is much more thermodynamically stable at high temperatures than $Cr_2O_3$.

Aluminides possess lower densities and high melting points, and exhibit desirable mechanical properties due to their ordered crystal structures. The strength of some intermetallics increases with temperature instead of decreasing; thus, they are ideally suited for high-temperature applications. Advantages of intermetallics based on $Ni_3Al$, $Fe_3Al$, and FeAl include:

(1) resistance to oxidation and carburization in both oxidizing and reducing carburizing atmospheres up to 1100° C.;

(2) better tensile and compressive yield strengths at 650 to 1100° C. than many nickel-based superalloys;

(3) fatigue resistance superior to that of nickel-based superalloys, (4) superior creep strength;

(5) excellent wear resistance at temperatures above 600° C. (wear resistance increases with temperature, similarly to yield strength, and the increase can be as much as a factor of 1000); and (6) the formation of alumina on the surface by preoxidation, which provides good chemical compatibility for many environments.

Very few materials provide fully adherent, robust and stable alumina surface films even at 1000° C. Most of the existing ferrous and nonferrous alloys contain less than 2 wt % Al, and can only provide a chromia scale. Some of the superalloys contain about 5 wt % Al, and the alumina film formed on their surfaces is not fully protective. Superalloys are generally coated with NiAl by chemical vapor deposition such that the surface provides alumina film on exposure to oxygen at high temperatures. In some cases, superalloys have been coated with platinum to provide a platinum aluminide coating on the surface. Platinum aluminide coatings are known to be effective in providing an adherent alumina layer on exposure to oxygen.

While alumina layers can be obtained on superalloys, the presence of high chromium content and low aluminum content is known to permit degradation in superalloys over a period of time. Also, chemical vapor deposition (CVD) of aluminide coatings is an expensive and time-consuming process, and to date only the aircraft industry makes significant use of these coatings for refurbishing turbine engine components. Chromia formed on the surfaces of most alloys is not thermodynamically stable beyond 900° C. and tends to peel off when thermally cycled. While chromia is considered a reasonable insulator at room temperature, its electrical resistivity falls at high temperatures rendering it unsuitable for use as a substrate for electronic circuits. Differences in coefficients of thermal expansion between the chromia and conductive elements applied by today's thick-film pastes make it unlikely that any commercial alloy with a chromia surface layer can be used as a substrate for electronic circuits. Since commercial thick-film pastes require firing temperatures of 950° C. and are thus only compatible with alumina, additional materials, manufacturing process, and techniques must be developed before they can be used with other substrate materials.

Today's printed electronic circuits are built on substrates made of polymers, plastics, ceramics, and other materials. Alumina substrates are used in both thick film and thin film embodiments. Examples include 96% alumina sold by Kyocera Corporation, S-22 Kiainoue-cho, Higashino, Yamashina-Ku, Kyoto 67, Japan and thick film alumina tape with borosilicate binder sold by DuPont Corporation, Wilmington, Del. Both are fragile, and both have relatively low thermal conductivities. Higher thermal conductivities are desirable for use in state-of-the-art power integrated circuit chips, in which it is desirable to dissipate heat in the range of 50 to 100 Watts per square centimeter ($W/cm^2$). Efforts have been and are currently being made world-wide to find or develop materials with the desired high-temperature strength and high thermal conductivities for these applications.

It is therefore desirable to provide substrates which can utilize existing materials, technologies, and equipment while also having more desirable mechanical integrity and thermal dissipation characteristics.

OBJECTS OF THE INVENTION

Accordingly, it is an object of the claimed invention to provide electronic circuits having new and improved metallic substrate materials, the substrates having improved mechanical and thermal properties and also having an electrically insulating oxide on the surface.

It is another object of the claimed invention to provide electronic circuits having new and improved metallic substrate materials using new and improved methods to provide improved mechanical and thermal properties and an electrically insulating oxide on the surface.

Further and other objects of the present invention will become apparent from the description contained herein.

SUMMARY OF THE INVENTION

In accordance with one aspect of the present invention, the foregoing and other objects are achieved by an electronic component which comprises: a substrate comprising a body having a surface, the body comprising a material selected from the group consisting of NiAl- and $Ni_3Al$-based alloys and combinations thereof; an adherent alumina layer covering at least a portion of the surface, the alumina layer having an outer surface; and at least one adherent conductive element operably disposed upon at least a portion of the outer surface, at least a portion of the conductive element being electrically insulated from the body by the alumina layer.

In accordance with a second aspect of the present invention, the foregoing and other objects are achieved by a method for making an electronic component which comprises the steps of: providing a body having a surface, the body comprising a material selected from the group consisting of NiAl- and $Ni_3Al$-based alloys and combinations thereof; heating at least a portion of the surface in a gaseous environment containing oxygen to form an adherent alumina layer covering at least a portion of the surface, the alumina layer having an outer surface; and disposing at least one adherent conductive element upon at least a portion of the outer surface, at least a portion of a conductive element being electrically insulated from the body by the alumina layer therebetween.

BRIEF DESCRIPTION OF THE DRAWING

In the drawing,

FIG. 1 is a sectional view through the NiAl or $Ni_3Al$ body 1 and surface 2, before.

FIG. 2 is a sectional view through the substrate for an electronic circuit 5 after oxidation showing the NiAl or $Ni_3Al$ body 1, and further showing the alumina layer 6 and outer surface 7.

FIG. 3 is a sectional view through the electronic circuit component showing the NiAl or $Ni_3Al$ body 1, and alumina layer 6, and further showing a conductive element 10.

FIG. 4 is a sectional view through the electronic circuit component showing the NiAl or $Ni_3Al$ body 1, the alumina layer 6, a conductive element 10, and layer of metal 15.

For a better understanding of the present invention, together with other and further objects, advantages and capabilities thereof, reference is made to the following disclosure and appended claims in connection with the above-described drawing.

DETAILED DESCRIPTION OF THE INVENTION

A fully adherent alumina layer formed on the surface of $Ni_3Al$ and NiAl was demonstrated by the applicants to be an electrical insulator, and the alumina-coated NiAl or $Ni_3Al$ was demonstrated to be useful as a substrate for an electronc component of an electronic circuit. It was further demonstrated that adherent conductive elements could be printed on the surface of the alumina layer to produce an electronic component of an electronic circuit. It was yet further demonstrated by the applicants that the insulating film withstands thermal and mechanical stress experienced by the alumina layer in the manufacture of electronic components and withstands thermal and mechanical stresses encountered by the electronic circuit in service.

The invention disclosed and claimed herein provides a new and improved metallic substrate material for electronic circuits, the substrate having improved mechanical and thermal properties and also having an electrically insulating oxide on the surface. The present invention also provides a new and improved method for making electronic circuits having a metallic substrate material, the substrate having improved mechanical and thermal properties and also having an electrically insulating oxide on the surface. Other layers of materials such as copper or copper-nickel alloy may also be incorporated for improved thermal conductivity and mechanical properties.

The insulating film rigidly adheres to the substrate and has sufficient thickness such that electrically conductive elements placed on the alumina surface do not come in contact with the metallic substrate below the alumina. The physical properties of the insulating film are similar to conventional monolithic alumina electronic substrates which ensures compatibility of thick-film pastes with the alumina.

NiAl and $Ni_3Al$ form an alumina surface layer or film on heating in air and other oxygen-containing gas mixtures. The alumina provides an oxidation-resistant layer that is electrically insulating, mechanically strong, fully adherent to the substrate, and that is robust in withstanding mechanical vibration, thermal shock, and extremes in temperature. The electrically-insulative properties of the alumina layer are excellent and may be controlled and optimized by varying the oxidation temperature and time. The process can be accomplished in existing thick film furnaces now used to process substrates for electronic circuits. The thickness of alumina depends on the temperature at which it is oxidized and the composition of the gas atmosphere. In air, at temperatures between 900, and 1100° C., within a time period between 15 m and 2 h, NiAl and $Ni_3Al$ articles form electrically insulating, high-density alumina, providing an electrically insulating coating. The coated articles have excellent dielectric strength and superior mechanical properties such as strength and thermal conductivity compared to alumina tape, such as DuPont's alumina tape, and Kyocera tape since the alumina thereby produced is bonded to and stabilized by a metallic substrate. For example, thermal conductivity of the alumina-coated NiAl is 80 W/m K and is 40 times greater than that of DuPont's alumina tape, and is four times greater than that of commercially available pure alumina. The resultant high thermal conductivity allows dissipation of heat. The higher thermal conductivity and heat dissipation permits the construction and use of larger power chips, as well as higher operating temperatures and longer lifetimes for chips that generate heat energy. Both NiAl and $Ni_3Al$ materials can be processed easily in the manner described herein, using conventional metal-processing techniques.

After the alumina layer is formed, conventional processes such as thick film techniques are used to apply conductive elements to the alumina layer, resulting in an electronic component. Process steps include printing of thick film patterns using thick film pastes, drying, and firing.

To further enhance the thermal conductivity of the electronic component, a metal such as copper or alloy such as Cu—Al can be roll-bonded or otherwise welded or joined to the NiAl or $Ni_3Al$ material, preferably prior to forming the alumina surface layer. Roll bonding is easily accomplished because copper forms CuO, and CuO and alumina can be bonded easily using methods well known in the art. Because NiAl and $Ni_3Al$ can be formed, into various shapes, shape is not restricted to flat configurations.

Metals such as copper can also be thermally sprayed onto the NiAl and $Ni_3Al$ using a variety of methods such as plasma spray, flame spray, wire-arc spray, or high-velocity oxyfuel spray, all the aforementioned and other methods being well-known in the art.

EXAMPLE I

Among the nickel-aluminide alloys considered, a Ni₃Al-based intermetallic compound designated as IC-50, developed at the Oak Ridge National Laboratory (ORNL) for structural applications, was chosen. The composition of IC-50 is shown in Table 1 along with IC-218LZr, IC-221W, and a commercially available alloyHaynes 214. Except for IC-50, all the other compositions shown in Table 1 contain chromium in the range 7.7 to 16 wt %. The Ni₃Al-based alloy IC-50 is cold rollable and can be processed into sheets.

NiAl provides an alumina layer. Intermediate temperature oxidation at 700° C. was found to provide only $\theta$-Al$_2$O$_3$, and a higher temperature of 1100° C. is needed to obtain a fully adherent $\alpha$-Al$_2$O$_3$ layer. Among the $\gamma$-Al$_2$O$_3$, $\theta$-Al$_2$O$_3$, and $\alpha$-Al$_2$O$_3$ layers, $\alpha$-Al$_2$O$_3$ is a thermodynamically stable oxide scale and $\gamma$-Al$_2$O$_3$ and $\theta$-Al$_2$O$_3$ act as precursors to the formation of $\alpha$-Al$_2$O$_3$.

High-temperature oxidation in air or oxygen at temperatures above 900° C. is desirable to provide an Al$_2$O$_3$ film since oxidation below 900° C. leads to an undesirable spinel film, and an extremely long time is needed to form an $\alpha$-Al$_2$O$_3$ layer. In some cases, it is difficult to obtain an $\alpha$-Al$_2$O$_3$ layer.

Test pieces of the above-described Ni$_3$Al-based alloy IC-50 were oxidized in air in the range of 800 to 1200° C.

TABLE 1

| | Alloy (Wt %) | | | | | | | |
|---|---|---|---|---|---|---|---|---|
| Element | IC-221M[a] | IC-396[b] | HU[c] | IC-50[d] | IC-218LZr[e] | IC-221W | Haynes 214[f] | Alloy 800[f] |
| Al | 8.0 | 7.98 | — | 11.3 | 8.7 | 8.00 | 4.5 | 0.4 |
| Cr | 7.7 | 7.72 | 18.0 | — | 8.1 | 7.70 | 16.0 | 21.0 |
| Mo | 1.43 | 3.02 | — | — | — | 1.50 | — | — |
| Zr | 1.7 | 0.85 | — | 0.6 | 0.2 | 3.00 | — | — |
| B | 0.008 | 0.005 | — | 0.02 | 0.02 | 0.003 | — | — |
| C | — | — | 0.55 | — | — | — | 0.03 | 0.05 |
| Fe | — | — | 42.45 | — | — | — | 3.0 | 45.5 |
| Ti | — | — | — | — | — | — | — | 0.4 |
| Ni | 81.8 | 80.42 | 39.0 | 88.08 | 83.1 | 79.80 | 76.35 | 32.5 |
| Si | — | — | — | — | — | — | 0.1 | — |
| Y | — | — | — | — | — | — | 0.02 | — |

[a]Castable alloy for dynamic applications (minimum microporosity).
[b]Castable alloy for static applications (some microporosity).
[c]Cast alloy.
[d]Cold workable.
[e]Hot and cold workable.
[f]Wrought alloy.

To provide IC-50 test pieces for comparison, a cold rolled sheet of IC-50 with a thickness of 0.5 mm was cut into 5- by 5-cm sections. This size was selected to be similar to that of a commercially available alumina substrate, which was used for alumina test pieces. The IC-50 sheet was cut into similar dimensions as the alumina so that duplicate thick-film manufacturing process steps could be applied in an identical manner, and the performance of both materials as a substrate for electronics circuits could be compared. This size was chosen because the pilot scale and manufacturing scale firing furnaces used are designed for a nominal width of about 5 cm, and similar dimensions allow printing and firing of IC-50 and alumina test pieces for later comparison. It is important to note that IC-50 is ductile at room temperature and exhibits a tensile elongation of at least 20% while alumina is brittle with no ductility.

To ensure that the alumina film formed in the above-described manner is highly impervious and electrically insulating, Ni₃Al-based alloy IC-50 test pieces were oxidized in air in the range of 900 to 1200° C. for several hours. Much information exists on the oxidation behavior of Ni₃Al and NiAl. It is known in the art that oxidation resistance of Ni₃Al and NiAl ranks among the best of currently-available superalloys capable of forming alumina layers. While they offer oxidation resistance even at intermediate temperatures in the range of 400 to 800° C. in air and oxygen, the alloys were observed to undergo internal oxidation below 800° C. The oxide scale formed in air on Ni₃Al at ≧900° C. consists of spinel NiAl$_2$O$_4$ outer layer and an Al$_2$O$_3$ inner layer on the surface. It is also known that under the same conditions, for several hours. The oxidized surfaces were tested to determine their electrical conductivity with both two-probe and four-probe resistivity methods. A four-probe technique was used because it can provide true resistivity with minimal contribution from contact resistance. The electrical resistivity of IC-50 was determined to be in the range of 60 to 65 $\mu$ohm-cm, and the oxidized surfaces were totally insulative when tested using a Keithly four-probe unit.

Even longer oxidation times at 950° C. did not result in the formation of electrically insulating oxide, and the green color of the oxide indicated that the oxide contained a significant amount of NiO. Oxidation at high temperatures resulted in the formation of an electrically insulating aluminide layer, and a temperature of 1100° C. was found to provide an excellent alumina layer. Oxidation time of 2 h was found to be satisfactory. The electrical resistivity of the oxide layer formed on IC-50 was the same as the resistivity of pure alumina.

The surface texture of the test piece did not change significantly with oxidation, even though the surface color changed due to the formation of the aluminide film.

X-ray diffraction patterns of IC-50 before and after oxidation indicate that the surface consists of alumina film after oxidation with no reflections corresponding to IC-50. Photomicrographs of a cross-section of IC-50 show no oxide layer at 100×, and 400×, at oxidation temperatures of 900, 1000, and 1100° C. The aluminide layer formed on heating of IC-50 at 1100° C. for 2 h was fully adherent and continuous across the cross section with a thickness of 3.18 $\mu$m. Scratch tests showed that the surface is scratch resistant when oxidized at 1100° C.

After confirming the aluminide film formed on the surface of the IC-50 test pieces to be electrically insulative and scratch resistant, IC-50 and $Al_2O_3$ test pieces were screen printed with identical conductive patterns using a DuPont 9910 gold thick film paste. After the patterns were printed, they were then set aside to air dry at room temperature for approximately 10 minutes, then at 90° C. for 15 minutes and at 150° C. for between 10 and 15 minutes, consecutively. After drying, alumina and IC-50 test pieces were placed in a belt furnace with a 60 min cycle and fired in air with a peak temperature of 925° C. for 10 min. A step-wise heating procedure was employed for firing to ensure uniform decomposition of the binder followed by sintering of the thick film conductive material. FIG. 5 shows a schematic of a printed silk-screen pattern at a magnification of 2×.

After the firing process was complete, both IC-50 and alumina test pieces were checked for the adhesion of the conductive elements to the substrate. Adhesion of conductive elements to the alumina was expected since pastes are designed for use with alumina substrates. Adhesion of conductive paste to the oxidized IC-50 proved that commercial inks and existing firing schedules can be successfully used with an oxidized IC-50 substrate.

To ensure continuity in the conductive patterns, the conductive patterns were checked with probes. High conductivity of the patterns along with identical values between the alumina and oxidized IC-50 substrates indicated that the adhesion of the conductive paste was uniform across the patterned area. Testing was also done across the thickness and the high resistance across the thickness indicated that there was no detectable electrical leakage.

In the next step, a series of Panasonic resistors model no. ERJ-8GYJ100M, 100 ohm, ⅛ watt power, was installed on the test pieces. Motorola linear voltage regulators, model no. MC7805CT, fixed voltage, 3-terminal devices were used to supply current. The resistors were bonded to the substrate using TRA-CON epoxy, with Tra-duct 2902 adhesive resin. After all components were placed, the test pieces were placed in a vacuum oven at 100° C. for an hour to cure the epoxy. Two circuits were installed, both on the same side of each test piece. The opposite or back side of the circuits was used to test the thermal dissipation characteristics through the thickness of the substrates. At any time, only a single test piece was heated, and heat dissipation was noted by recording the temperature of the substrate either on the front side or back side of the test pieces.

First, an infrared camera was focused on the entire test piece, and one circuit was heated to varying temperatures to determine the voltage and current needed to heat the resistors. This was optimized to approximate a temperature at the back side of the circuit and on the entire substrate typical of at least what is experienced in today's circuit boards. The temperature was increased to 300° F. or higher to demonstrate that the oxidized IC-50 substrate can dissipate heat faster than a conventional alumina substrate. The results were recorded using an infrared camera.

Heat generation and heat dissipation were recorded during heating and cooling cycles. During the heating cycle a measured voltage was applied for 2 minutes. During the 2-minute cooling cycle, the temperature decreased from the peak heating temperature to ambient. Four minutes' data were recorded at each setting of voltage. The camera's cursor was placed on the image of the substrate, and the cursor temperature was monitored during heating and cooldown periods. Since two circuits were present on each test piece, the cursor was placed at the center of the test piece. Videotape recording of the infrared image was also conducted during the entire heating and cooling cycle.

Table 2 shows temperatures measured using the infrared camera on the front and back sides of the test pieces using 5.04, 7.82, and 9.06 V.

TABLE 2

Temperatures of substrates measured using an infrared camera

| Sample | Time (min) | Temperature (° C.) | | |
|---|---|---|---|---|
| | | 5.04 V, 0.67 A | 7.82 V, 0.99 A | 9.05 V, 1 A |
| IC-50 ($Ni_3Al$) Front Side | 1 | 24 | 26 | 27 |
| | 2 | 27 | 31 | 32 |
| | 3 | 26 | 29 | 30 |
| IC-50 ($Ni_3Al$) Back Side | 1 | 38 | 45 | 43 |
| | 2 | 46 | 57 | 59 |
| | 3 | 37 | 48 | 54 |
| $Al_2O_3$ Back Side | 1 | 29 | 35 | 72 |
| | 2 | 31 | 40 | 87 |
| | 3 | 29 | 31 | 45 |

Temperatures measured on a $Ni_3Al$-based IC-50 test piece on the front side were in the range of 20° C. to 34° C. An increase in temperature was observed with increase of time, and the temperature peaked at 2 min. The temperature dropped after the voltage was turned off. It is interesting to note that low temperatures were observed at the cursor location even when the voltage was 9.06 V. In the next set of experiments, temperatures were monitored on the back side of the circuit. Surprisingly, higher temperatures were observed on the back of the circuit as than on the front of the circuit. The temperatures were higher with the increase of voltage, and the peak temperature observed at 2 min was also higher on the back of the circuit. An unexpected result was that the maximum temperature observed at the cursor location on the back of the substrate was only 59° C. when the resistors were heated at 9 V with 1 A current for 2 min.

Since the above experiments indicated that monitoring of temperature on the back of the substrate can be meaningful, the temperature was monitored by heating the resistors placed on an alumina test piece with 5.04 and 7.82 V. The temperatures measured on the alumina test piece were lower than the temperatures observed on an $Ni_3Al$-based IC-50 sheet. But the temperatures measured at 9.06 V on the alumina test piece were almost 50% higher than the temperatures observed with an IC-50 test piece during heating cycles. Since the thermal conductivity of $Ni_3Al$ is higher than $Al_2O_3$, heat dissipated faster during the heat generation cycle, and the temperature difference between 2 and 3 min is only 5° C. The temperature difference between the peak temperature observed at 2 min and 1 min into the cooling cycle (i.e., at 3 min) is 42° C.

Next, images were digitally recorded at regular intervals of 0, 1, 2, 3, and 4 min to obtain spatial temperature profile across a much wider area of the substrate. A heating time of 2 min was used at voltages of 5.04, 7.82, and 9.06. The resulting data concurred with and confirmed the conclusions from the previous data; that the greater thermal conductivity of the IC-50 test piece permitted lower substrate temperatures than the similarly configured alumina substrate at the same power levels.

It is thus demonstrated that NiAl or $Ni_3Al$, when heated in an oxygen-containing gaseous atmosphere to produce an alumina layer on the surface of the NiAl or $Ni_3Al$, provide a new and useful substrate material; that upon application of adherent conductive elements to the alumina layer, provide a new and useful electronic component. The ductility of IC-50 allows the use of sheets of much larger dimensions such as those now manufactured using polyimide and other flexible substrates.

While there has been shown and described what are at present considered the preferred embodiments of the invention, it will be obvious to those skilled in the art that various changes and modifications can be made therein without departing from the scope of the inventions defined by the appended claims.

What is claimed is:

1. A method for making an electronic component comprising the steps of:
   (A) Providing a body having a surface, the body comprising a ductile material exhibiting a tensile elongation of at least 20% at room temperature selected from the group consisting of NiAl- and Ni$_3$Al-based alloys and combinations thereof,
   (B) Heating at least a portion of the surface in a gaseous environment containing oxygen to form an adherent alumina layer covering at least a portion of the surface, the alumina layer having an outer surface; and
   (C) Applying, by printing, drying, and firing a conductive paste, at least one adherent conductive element upon at least a portion of the outer surface, at least a portion of a conductive element being electrically insulated from the body by the alumina layer therebetween.

2. The method described in claim 1 further comprising the steps of:
   (A) Placing a layer of metal upon at least a portion of the body; and
   (B) Bonding the layer of metal to the portion of the body.

3. The method described in claim 2 wherein the layer of metal is selected from the group consisting of copper and copper-aluminum alloys.

4. The method described in claim 2 wherein the bond between the layer of metal and the body is achieved by roll bonding.

5. The method described in claim 2 wherein the bond between the layer of metal and the body is achieved by a process selected from the group consisting of plasma spraying, flame spraying, wire-arc spraying, and high-velocity oxyfuel spraying.

6. The method as described in claim 1 wherein the heating step is performed in air at a temperature between about 900° C. and about 1200° C.

7. The method as described in claim 1 wherein the body further comprises B in sufficient quantity to provide ductility of at least 20% elongation at room temperature.

8. The method as described in claim 1 wherein the body further comprises up to about 3 wt % Zr.

9. The method as described in claim 1 wherein the body comprises IC50.

* * * * *